US010635623B2

(12) United States Patent
Kondo et al.

(10) Patent No.: US 10,635,623 B2
(45) Date of Patent: Apr. 28, 2020

(54) SEMICONDUCTOR LAYERED DEVICE WITH DATA BUS

(71) Applicant: MICRON TECHNOLOGY, INC., Boise, ID (US)

(72) Inventors: Chikara Kondo, Hachioji (JP); Akinori Funahashi, Tachikawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/150,505

(22) Filed: Oct. 3, 2018

(65) Prior Publication Data

US 2019/0034370 A1 Jan. 31, 2019

Related U.S. Application Data

(62) Division of application No. 15/468,742, filed on Mar. 24, 2017, now Pat. No. 10,146,719.

(51) Int. Cl.

| G06F 13/40 | (2006.01) |
| G11C 7/10 | (2006.01) |
| G11C 29/12 | (2006.01) |
| G11C 29/36 | (2006.01) |
| G11C 29/02 | (2006.01) |

(Continued)

(52) U.S. Cl.
CPC ............ *G06F 13/4022* (2013.01); *G11C 7/02* (2013.01); *G11C 7/1006* (2013.01); *G11C 7/1069* (2013.01); *G11C 7/1096* (2013.01); *G11C 29/025* (2013.01); *G11C 29/12015* (2013.01);

(Continued)

(58) Field of Classification Search
CPC .......................... G11C 7/1006; G06F 13/4022
See application file for complete search history.

(56) References Cited

U.S. PATENT DOCUMENTS 4,365,247 A * 12/1982 Bargeton ................. H04B 1/74
340/2.9
5,272,675 A    12/1993 Kobayashi
(Continued)

FOREIGN PATENT DOCUMENTS

| JP | 11-283396 | 10/1999 |
| KR | 20150060346 A | 6/2015 |

(Continued)

OTHER PUBLICATIONS

International Search Report and Written Opinion dated Jul. 9, 2018 for PCT Application No. PCT/US2018/023629, 13 pages.

(Continued)

*Primary Examiner* — Joseph D Torres
(74) *Attorney, Agent, or Firm* — Dorsey & Whitney LLP

(57) ABSTRACT

Apparatuses and methods of data communication between semiconductor chips are described. An example apparatus includes: a first die including a first switch circuit that receives a plurality of data signals, and further provides the plurality of data signals to a plurality of corresponding first ports among a plurality of first data ports and a first data redundancy port; and a second die including a second switch circuit that receives the plurality of data signals from the first die at a plurality of corresponding second ports among a plurality of second data ports and a second data redundancy port and further provides the plurality of data signals to a memory array.

10 Claims, 15 Drawing Sheets

(51) Int. Cl.
*G11C 7/02* (2006.01)
*G11C 5/06* (2006.01)

(52) U.S. Cl.
CPC .............. *G11C 29/36* (2013.01); *G11C 5/063* (2013.01); *G11C 2029/1202* (2013.01)

(56) References Cited

U.S. PATENT DOCUMENTS

| | | | | |
|---|---|---|---|---|
| 5,274,593 | A * | 12/1993 | Proebsting | G11C 29/848 365/200 |
| 5,331,320 | A | 7/1994 | Cideciyan et al. | |
| 5,999,458 | A | 12/1999 | Nishimura et al. | |
| 6,032,248 | A | 2/2000 | Curry et al. | |
| 6,115,301 | A * | 9/2000 | Namekawa | G11C 29/848 365/200 |
| 6,307,794 | B1 * | 10/2001 | Haga | G11C 29/848 365/200 |
| 6,333,915 | B1 * | 12/2001 | Fujita | H04L 12/6402 370/223 |
| 6,367,027 | B1 | 4/2002 | Frankowsky | |
| 6,518,893 | B1 | 2/2003 | Robinson | |
| 6,584,526 | B1 | 6/2003 | Bogin et al. | |
| 6,741,190 | B2 | 5/2004 | Henkel et al. | |
| 6,747,625 | B1 | 6/2004 | Han et al. | |
| 6,844,833 | B2 | 1/2005 | Cornelious et al. | |
| 6,963,220 | B2 | 11/2005 | Momtaz et al. | |
| 7,113,550 | B2 | 9/2006 | Stonecypher et al. | |
| 7,280,412 | B2 | 10/2007 | Jang et al. | |
| 7,405,981 | B2 | 7/2008 | Dietrich | |
| 7,405,984 | B2 | 7/2008 | Hughes | |
| 7,501,963 | B1 | 3/2009 | Hollis | |
| 7,551,167 | B2 | 6/2009 | Park et al. | |
| 7,616,133 | B2 | 11/2009 | Hollis | |
| 7,701,368 | B2 | 4/2010 | Hollis | |
| 8,014,196 | B2 | 9/2011 | Graef | |
| 8,018,358 | B2 | 9/2011 | Hollis | |
| 8,026,740 | B2 | 9/2011 | Hollis | |
| 8,094,045 | B2 | 1/2012 | Hollis | |
| 8,207,796 | B2 | 6/2012 | Mangaiahgari | |
| 8,207,976 | B2 | 6/2012 | Hein | |
| 8,433,190 | B2 * | 4/2013 | Wellbrock | H04B 10/0777 359/334 |
| 8,762,813 | B2 | 6/2014 | Tang et al. | |
| 8,766,828 | B2 | 7/2014 | Hollis | |
| 8,826,101 | B2 | 9/2014 | Hargan | |
| 8,854,236 | B2 | 10/2014 | Hollis | |
| 8,879,654 | B2 | 11/2014 | Hollis | |
| 9,025,409 | B2 | 5/2015 | Shaeffer | |
| 9,048,856 | B2 | 6/2015 | Hollis | |
| 9,091,727 | B1 | 7/2015 | Lupu et al. | |
| 9,116,828 | B2 | 8/2015 | Hollis | |
| 9,148,170 | B2 | 9/2015 | Hollis | |
| 9,268,719 | B2 | 2/2016 | Shaeffer | |
| 9,405,721 | B2 | 8/2016 | Ayyapureddi et al. | |
| 9,798,693 | B2 * | 10/2017 | Hollis | G06F 13/287 |
| 9,922,686 | B2 | 3/2018 | Hollis et al. | |
| 10,146,719 | B2 | 12/2018 | Kondo et al. | |
| 2002/0156953 | A1 | 10/2002 | Beiley et al. | |
| 2003/0170020 | A1 * | 9/2003 | Chaudhuri | H04B 10/032 398/5 |
| 2004/0109509 | A1 | 6/2004 | Stonecypher et al. | |
| 2004/0135709 | A1 | 7/2004 | Cornelius et al. | |
| 2005/0288642 | A1 | 12/2005 | Kim | |
| 2005/0289435 | A1 | 12/2005 | Mulla et al. | |
| 2007/0008008 | A1 | 1/2007 | Kwack et al. | |
| 2007/0096950 | A1 | 5/2007 | Yang et al. | |
| 2007/0226430 | A1 | 9/2007 | Dietrich | |
| 2008/0019451 | A1 | 1/2008 | Jang et al. | |
| 2008/0225603 | A1 | 9/2008 | Hein | |
| 2008/0247501 | A1 | 10/2008 | Zhang | |
| 2009/0179782 | A1 | 7/2009 | Hollis | |
| 2009/0182918 | A1 | 7/2009 | Hollis | |
| 2009/0190690 | A1 | 7/2009 | Kuwata | |
| 2009/0238300 | A1 | 9/2009 | Hollis | |
| 2009/0274245 | A1 | 11/2009 | Brown et al. | |
| 2009/0313521 | A1 * | 12/2009 | Hollis | G06F 11/1008 714/752 |
| 2010/0026533 | A1 | 2/2010 | Hollis | |
| 2010/0027989 | A1 * | 2/2010 | Lewis | H04J 14/0227 398/2 |
| 2010/0042889 | A1 | 2/2010 | Hargan | |
| 2010/0199017 | A1 | 8/2010 | Hollis | |
| 2011/0018517 | A1 | 1/2011 | Candage et al. | |
| 2011/0116786 | A1 * | 5/2011 | Wellbrock | H04B 10/032 398/2 |
| 2011/0156934 | A1 | 6/2011 | Bae et al. | |
| 2011/0222623 | A1 * | 9/2011 | Hollis | H04L 25/0278 375/295 |
| 2011/0252171 | A1 | 10/2011 | Dearth et al. | |
| 2011/0316726 | A1 | 12/2011 | Hollis | |
| 2012/0131244 | A1 * | 5/2012 | Abbasfar | G06F 13/4265 710/105 |
| 2012/0195131 | A1 | 8/2012 | Pax | |
| 2012/0206280 | A1 * | 8/2012 | Abbasfar | G06F 13/4072 341/51 |
| 2013/0091327 | A1 | 4/2013 | Shido et al. | |
| 2013/0307708 | A1 | 11/2013 | Hollis | |
| 2014/0053040 | A1 | 2/2014 | Hargan | |
| 2014/0281075 | A1 * | 9/2014 | Hollis | G06F 13/287 710/106 |
| 2014/0289440 | A1 | 9/2014 | Shu | |
| 2014/0289460 | A1 | 9/2014 | Shu et al. | |
| 2014/0313062 | A1 | 10/2014 | Hollis | |
| 2015/0022383 | A1 | 1/2015 | Hollis | |
| 2015/0227417 | A1 | 8/2015 | Kim | |
| 2015/0229325 | A1 | 8/2015 | Hollis | |
| 2015/0287446 | A1 | 10/2015 | Hong | |
| 2015/0356047 | A1 | 12/2015 | Ayyapureddi et al. | |
| 2016/0173128 | A1 * | 6/2016 | Ware | G06F 11/1068 714/768 |
| 2017/0337951 | A1 | 11/2017 | Hollis et al. | |
| 2018/0005671 | A1 | 1/2018 | Hollis et al. | |
| 2018/0047432 | A1 | 2/2018 | Kondo et al. | |
| 2018/0277175 | A1 | 9/2018 | Kondo et al. | |

FOREIGN PATENT DOCUMENTS

| | | |
|---|---|---|
| WO | 2014151637 A1 | 9/2014 |
| WO | 2014193574 A1 | 12/2014 |
| WO | 20170200820 A2 | 11/2017 |
| WO | 2018175634 A1 | 9/2018 |

OTHER PUBLICATIONS

U.S. Appl. No. 15/703,365, entitled "Apparatuses and Methods for Performing Intra-Module Databus Inversion Operations", filed on Sep. 13, 2017.

U.S. Appl. No. 15/987,895, titled "Semiconductor Layered Device with Data Bus Inversion", filed May 23, 2018, pp. all.

Cheng, et al., "Memory bus encoding for low power: a tutorial", Quality Electronic Design, 2001 International Symposium on Mar. 26-28, 2001, Piscataway, NJ, USA, IEEE Mar. 26, 2001, pp. 199-204.

Hollis "Data Bus Inversion in High-Speed Memory Applications", IEEE Transactions on Circuits and Systems—II Express Briefs vol. 56, No. 4, Apr. 2009, pp. all.

Rokhani, et al. "Low-Power Bus Transform Coding for Multilevel Signals", IEEE Asia Pacific Conference on Circuits and Systems, Dec. 2006, pp. 1272-1275.

Shin, Youngsoo et al., "Partial Bus-Invert Coding for Power Optimization of Application-Specific Systems", IEEE Transactions on Very Large Scale Integration (VLSI) Systems, vol. 9, No. 2, Apr. 2001, pp. all.

Stan, et al., ""Bus-invert coding for low-power I/O"", IEEE Transactions on Very Large Scale Integration (VLSI) Systems, IEEE Service Center, Piscataway, NJ, USA, vol. 3, No. 1, Mar. 1, 1995, pp. 49-58.

Stan, et al., "Bus-Invert Coding for Low-Power I/O", IEEE Transactions on Very Large Scale Integration, vol. 3, No. 1, Mar. 1995, pp. 49-58.

(56) References Cited

OTHER PUBLICATIONS

U.S. Appl. No. 16/163,471, titled "Semiconductor Device with First-in-First-Out Circuit", filed Oct. 17, 2018, pp. all.

* cited by examiner

| EN | Di | Do | DBlo |
|---|---|---|---|
| 0 | Dn | Dn | 0 |
| 1 | Dn (# of bits that change from H to L or L to H with respect to Dn-1 being less than a half of bits of Di) | Dn | 0 |
| 1 | Dn ((# of bits that change from H to L or L to H with respect to Dn-1 being equal to or larger a half of bits of Di) | ~Dn | 1 |

| MR-RDBI enable | MR-WDBI enable | IF Decoder En | IF Encoder En | CORE Decoder En | CORE Encoder En |
|---|---|---|---|---|---|
| 0 | 0 | 0 | 0 | 0 | 0 |
| 0 | 1 | 0 | 0 | 1 | 0 |
| 1 | 0 | 0 | 0 | 0 | 1 |
| 1 | 1 | 0 | 0 | 1 | 1 |

RedEn = 0

*FIG. 4B*

| MR-RDBI enable | MR-WDBI enable | IF Decoder En | IF Encoder En | CORE Decoder En | CORE Encoder En |
|---|---|---|---|---|---|
| 0 | 0 | 0 | 0 | 0 | 0 |
| 0 | 1 | 1 | 0 | 0 | 0 |
| 1 | 0 | 0 | 1 | 0 | 0 |
| 1 | 1 | 1 | 1 | 0 | 0 |

RedEn >= 1

*FIG. 4C*

| RedEN | Dchip | Dtsv | Dred |
|---|---|---|---|
| 0 | D[7:0] | D[7:0] | DBI |
| 1 | D[7:0] | {D[7:1],Hi-Z} | D[0] |
| 2 | D[7:0] | {D[7:2],HIZ,D[1]} | D[0] |
| 3 | D[7:0] | {D[7:3],HIZ,D[2:1]} | D[0] |
| 4 | D[7:0] | {D[7:4],HIZ,D[3:1]} | D[0] |
| 5 | D[7:0] | {D[7:5],HIZ,D[4:1]} | D[0] |
| 6 | D[7:0] | {D[7:6],HIZ,D[5:1]} | D[0] |
| 7 | D[7:0] | {D[7],HIZ,D[6:1]} | D[0] |
| 8 | D[7:0] | {HIZ,D[7:1]} | D[0] |

US 10,635,623 B2

SEMICONDUCTOR LAYERED DEVICE WITH DATA BUS

CROSS-REFERENCE TO RELATED APPLICATION(S)

This application is a divisional of U.S. patent application Ser. No. 15/468,742, filed Mar. 24, 2017. The aforementioned application is incorporated by reference herein, in its entirety, and for any purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dies) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface chip and vertically stacked DRAM chips. A typical HBM stack of four DRAM chips (e.g., core chips) has two 128-bit channels per chip for a total of eight input/output channels and a width of 1024 bits in total. An interface (IF) chip of the HBM provides an interface with the eight input/output channels, which function independently of each other. In the HBM, data transmission between chips (e.g., between an interface chip and core chips) via through substrate vias (TSVs) may cause high power consumption, due to current charge and discharge at the TSVs as capacitors.

3D memory devices (e.g., HBM and the like) support data bus inversion during write and read operation for reducing currents in data transmission between a host controller and chips (e.g., dies). As shown in FIG. 1A, a data bus inversion ("DBI") encoder in a 3D memory device encodes write data using a DBI algorithm and transmits DBI bit or bits indicating whether the write data from a host device to a memory device chip have been inverted. The DBI encoder compares current data bits Di on a data bus with previous data bits Dn-1 on the data bus and minimizes a number of data bits that simultaneously transition between the previous data bits and the current data bits by transmitting the data bits Do after inversion when the number of data bits that simultaneously transition is more than half of the number of the data bits, as shown in FIG. 1B. Thus, the data bus inversion decreases a number of data bits with transition on the data bus and reduces currents due to transition of the data bits. In order to signal whether the data inversion has been applied, one DBI bit DBIo is added to the data bits. The DBI encoding operation is activated responsive to the assertion of a DBI enable signal EN. In case of the 3D memory devices with a plurality of dies having a number of TSVs for data transmissions between the plurality of dies, a number of DBI bits to support DBI increases and the number of TSVs increases accordingly. The output data bits Do and the DBI bit DBIo from the DBI encoder in FIG. 1A are supplied to a DBI decoder as input data bits Do and input DBI bit DBIi as shown in FIG. 2A, so that the encoded DBI bits are decoded to the original data bits as shown in FIG. 2B. The DBI decoding operation is also activated responsive to the assertion of the DBI enable signal commonly provided to the DBI encoder and the DBI decoder.

In a 3D memory device, on the other hand, there may be defects in connection (e.g., TSVs), such as improper connections to adjacent wirings, open terminals with high impedance due to poor connection, high resistance due to contamination, in TSVs for transmitting data between adjacent dies stacked to each other. This type of defects in connections may exacerbate a yield of devices. In order to enhance the yield of devices, a redundant TSV and a domino circuit are provided in each die, as shown in FIG. 3. The detailed operations of the domino circuit using the redundant TSV will be omitted as being well known in the art.

BRIEF DESCRIPTION OF THE DRAWINGS

FIG. 4B is a truth table of mode register setting and enable inputs of the IF chip and the core chip of FIG. 4A, in accordance with an embodiment of the present disclosure.
FIG. 4C is a truth table of mode register setting and enable inputs of the IF chip and the core chip of FIG. 4A, in accordance with an embodiment of the present disclosure.
FIGS. 5A to 5I are schematic diagrams of data bus coupling between an IF domino circuit and a core domino circuit in a memory chip in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 4A:
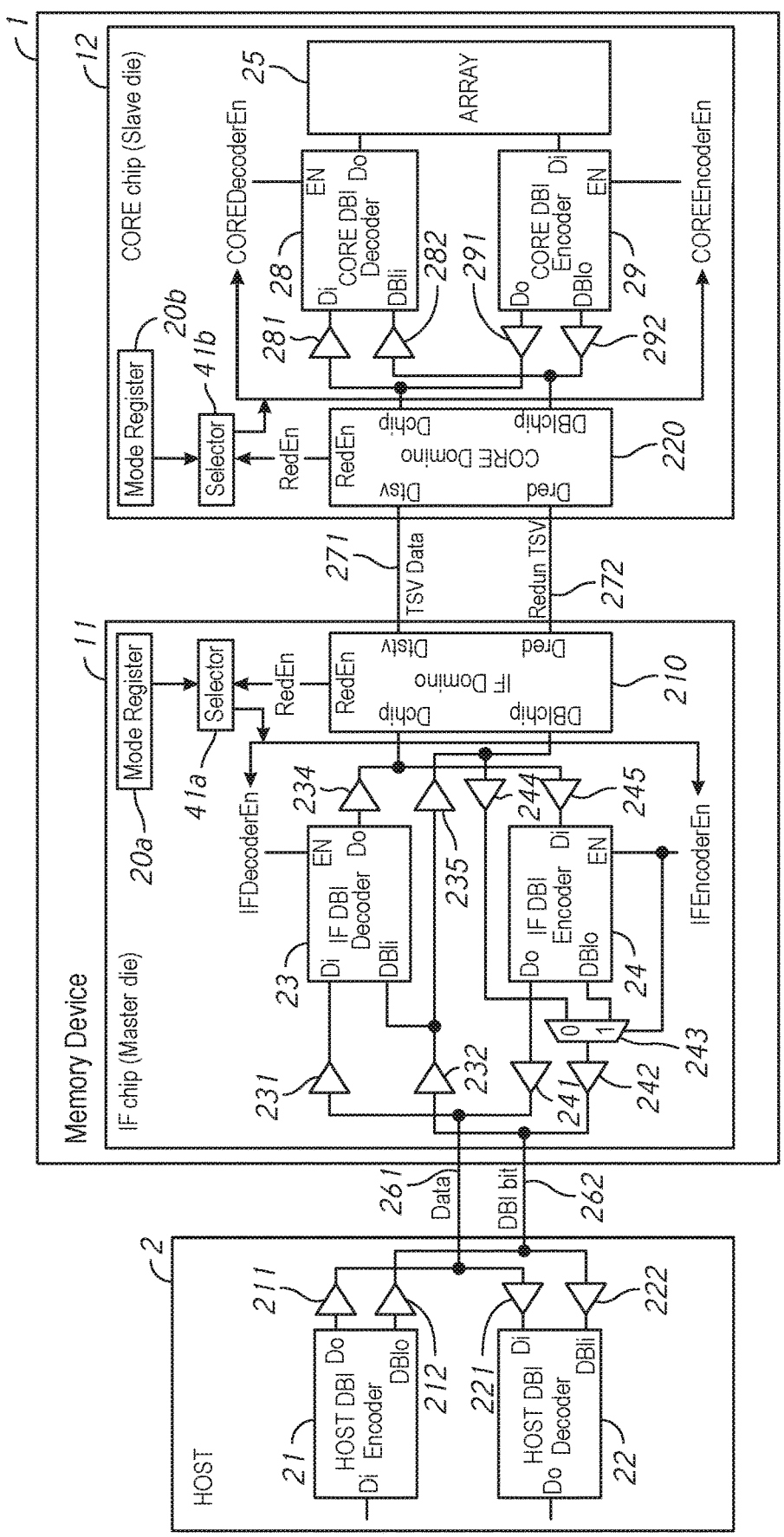
FIG. 4A is a block diagram of a host device and a memory device including an IF chip and a core chip in accordance with an embodiment of the present disclosure.

FIG. 4A is a block diagram of a host device 2 and a memory device 1 including an IF chip 11 and a core chip 12 in accordance with an embodiment of the present disclosure. The memory device 1 may include the IF chip 11 and a core chip 12 that are stacked with each other. In some embodiments, one or more other core chips may further be stacked with one another over the core chip 12. The host device 2 and the memory device 1 may communicate DBI data which has been converted (e.g., encoded, decoded, etc.) using a DBI algorithm. The host device 2 may include a host DBI encoder 21. While writing data bits, the host DBI encoder 21 may receive current data bits (Dcur) after receiving previous data bits (Dpre) at a data input node (Di). The host DBI encoder 21 may encode Dcur with the DBI encoding, when a number of bits that transition in a voltage or logic level (e.g., from a logic high level to a logic low level, or the logic low level to the logic high level) from Dpre to Dcur is more than a half of the number of the data bits in Dcur. For example, the host DBI encoder 21 may provide Dcur without inversion to an output buffer 211 coupled to data nodes 261 from a data output node (Do) and may further provide a DBI bit "0" indicative of "no DBI encoding" to an output buffer 212 coupled to a DBI node 262 from a DBI output node (DBIo), if the number of the data bits which transition from Dpre to Dcur is fewer than a half of the number of the data bits to be transmitted. The host DBI encoder 21 may provide data Dcur which are inverted to the output buffer 211 coupled to the data nodes 261 and may further provide the DBI bit "1" indicative of "DBI encoding" to the output buffer 212 coupled to the DBI node 262, if the number of the data bits which transition from Dpre to Dcur is equal to or more than a half of the number of the data bits to be transmitted.

Figures 1A, 1B:
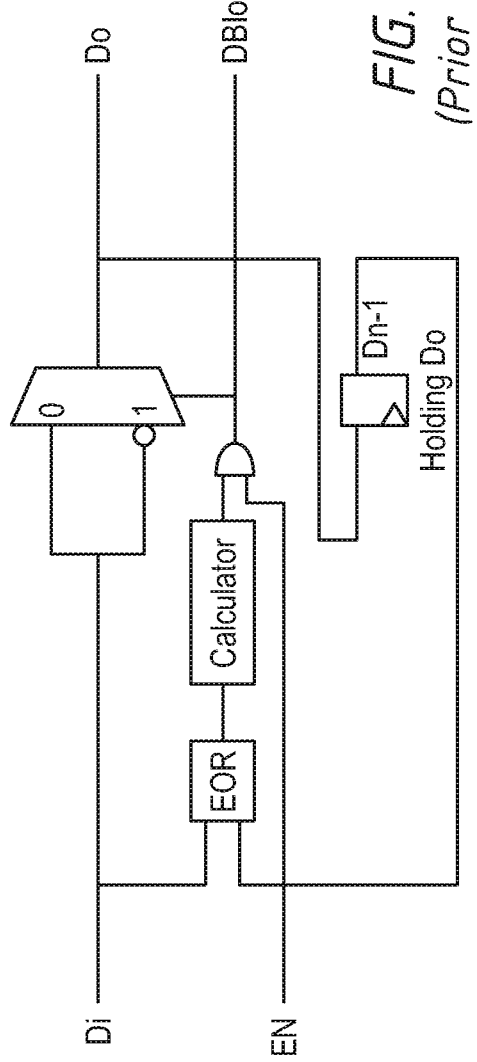
FIG. 1A is a schematic diagram of a DBI encoder according to the prior art.
FIG. 1B is a truth table indicative of an operation of the DBI encoder according to the prior art.
Figures 2A, 2B:
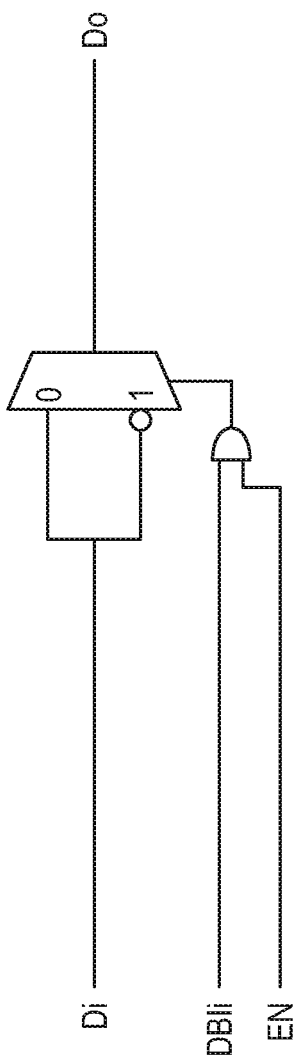
FIG. 2A is a schematic diagram of a DBI decoder according to the prior art.
FIG. 2B is a truth table indicative of an operation of the DBI decoder according to the prior art.
Figures 3A, 3B:
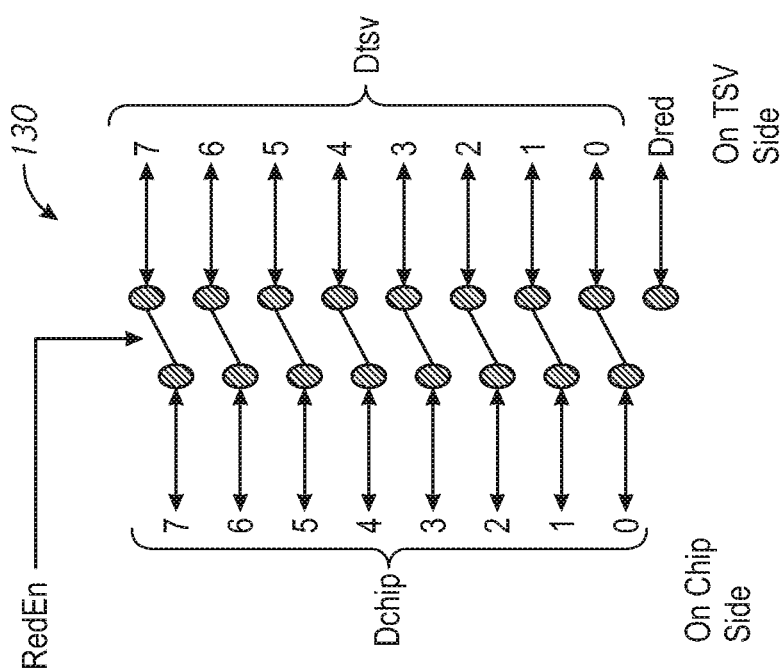
FIG. 3A is a schematic diagram of a domino circuit according to the prior art.
FIG. 3B is a truth table indicative of an operation of the domino circuit according to the prior art.

The IF chip 11 in the memory device 1 may include an IF DBI decoder 23. The IF DBI decoder 23 may receive the data bits on the data nodes 261 at an input buffer 231 and may further receive the DBI bit on the DBI node 262 at a DBI input buffer 232. The IF DBI decoder 23 may include a Di node that receives the data bits from the input buffer 231 and a DBI input node (DBIi) node that receives the DBI bit from the DBI input buffer 232. The IF DBI decoder 23 may be activated by IFDecoderEn signal received at an enable (EN) input of the IF DBI decoder 23. The IF DBI decoder 23 determines that the data bits are not subject to DBI-encoding and provides the data bits from a Do node to a TSV data bus 27 coupled to the core chip 12 via an output buffer 234, if the IFDecoderEn signal is inactive (e.g., the logic low level). The IF DBI decoder 23 determines that data is subject to DBI-encoding, if the IFDecoderEn signal is active (e.g., the logic high level). The IF DBI decoder 23 may further examine if the DBI bit received at the DBIi node is active while the IFDecoderEn signal is active. If the DBI bit is active (e.g., "1") indicative of "DBI encoding", the IF DBI decoder 23 may decode the data bits at the Di node and provide the decoded data bits to the Do node. If the DBI bit is inactive (e.g., "0"), the IF DBI decoder 23 may provide the data bits at the Di node to the Do node without data inversion The IF chip 11 in the memory device 1 may include a DBI encoder 24. The IF DBI encoder 24 may include a Di node that receives data bits. The IF DBI encoder 24 may be activated by IFEncoderEn signal received at an enable (EN) input of the IF DBI encoder 24. The IF DBI encoder 24 determines that the current data bits are not subject to DBI-encoding and provides the current data bits from a Do node to the data nodes 261 coupled to the host device 2 via an output buffer 241, if the IFEncoderEn signal is inactive (e.g., the logic low level). The IF DBI encoder 24 determines that the current data bits are subject to DBI-encoding, if the IFEncoderEn signal is active (e.g., the logic high level). For example, the IF DBI encoder 24 may provide the current data bits (e.g., without inversion) from the Do node to the output buffer 241 coupled to the data nodes 261 and may further provide a DBI bit "0" indicative of "no DBI encoding" from a DBI output node (DBIo) via a multiplexer 243 to an output buffer 242 coupled to the DBI node 262, if the number of the data bits which transition from previous data bits read from the array 25 to the current data bits is fewer than a half of the number of the data bits to be transmitted. The IF DBI encoder 24 may provide data bits which are the current data bits after inversion to the output buffer 241 coupled to the data nodes 261 and further provide the DBI bit "1" indicative of "DBI encoding" via the multiplexer 243 to the output buffer 242 coupled to the DBI node 262, if the number of the data bits which transition from the previous data bits to the current data bits is equal to or more than a half of the number of the data bits to be transmitted. The multiplexer 243 may select the DBIo of the encoder 24 when the IFEncoderEn signal is active (e.g., the logic high level). On the other hand, when the IFEncoderEn signal is inactive (e.g., the logic low level), the multiplexer 243 may select the output of a DBI input buffer 244 coupled to a DBIchip node of an IF domino circuit 210 that will be described later. The host device 2 may include a host DBI decoder 22. The host DBI decoder 22 may receive the data bits from the data nodes 261 via an input buffer 221 at a data input node (Di) and the DBI bit from the DBI node 262 via an input buffer 222 at a DBI input node (DBIi). The IF chip 11 and the core chip 12 may include the IF domino circuit 210 and a core domino circuit 220, respectively. For example, the IF domino circuit 210 may be located between the output node of the output buffer 234 (or the input node of the DBI input buffer 244) and a set of TSV data nodes 271. The IF domino circuit 210 may further include a Dred node coupled to a redundant TSV node 272. For example, the core domino circuit 220 may be located between an input node of an input buffer 281 (or an output node of an output buffer 291) and the set of TSV data node 271. The core domino circuit 220 may further include a Dred node coupled to the redundant TSV node 272. Description of components corresponding to the domino circuit 130 in FIGS. 3A and 3B will not be repeated.

The core chip 12 may include a core DBI encoder 29 and a core DBI decoder 28, and the DBI bit may be transmitted to the core chip 12 through the redundant TSV 272. The core DBI decoder 28 may perform the same operations as the IF DBI decoder circuit 23 responsive to a COREDecoderEn signal. The core DBI encoder 29 may perform the same operations as the IF DBI encoder circuit 24 responsive to a COREEncoderEn signal.

Figures 4D, 4E:
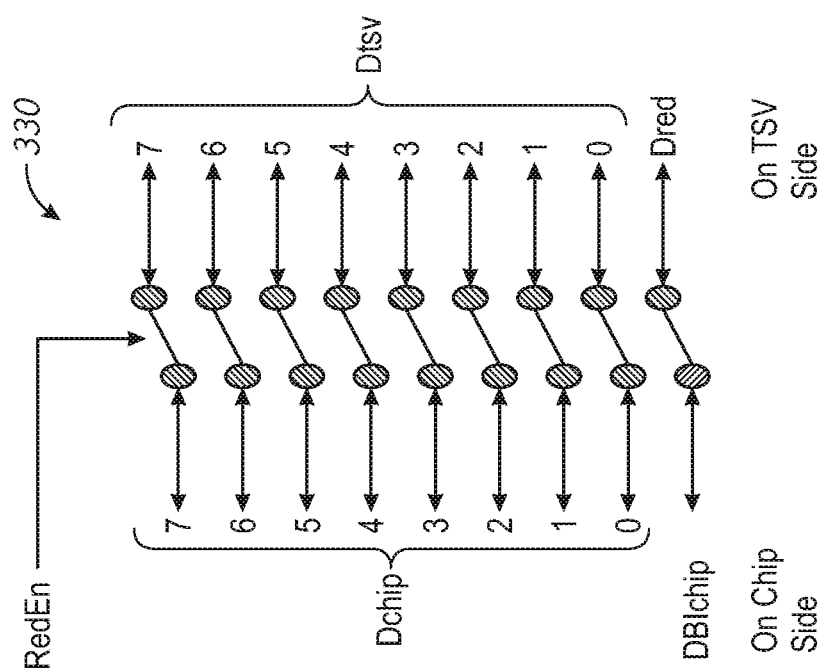
FIG. 4D is a schematic diagram of data bus coupling in a domino circuit in a memory chip in accordance with an embodiment of the present disclosure.
FIG. 4E is a truth table of data bus coupling in the domino circuit in accordance with an embodiment of the present disclosure.

FIG. 4D is a schematic diagram of data bus coupling in a domino circuit in a memory chip in accordance with an embodiment of the present disclosure. FIG. 4E is a truth table of data bus coupling in the domino circuit in accordance with an embodiment of the present disclosure. The domino circuit 330 shown FIG. 4D may be used as the IF domino circuit 210 and the core domino circuit 220 of FIG. 4A. For example, the domino circuit 330 may include chip data ports Dchip [0:(x−1)] (x: a number of bits of data) coupled to a data node in a chip and TSV data ports Dtsv[0:x] and/or a data redundancy port Dred. The domino circuit 330 may further include a DBIchip port that may be coupled to the data redundancy port Dred. When a via coupled to a TSV data port [k](k: a positive integer smaller than (x−1)) is defective and the redundancy enable signal RedEN is greater than "0", a defective via may be decoupled (kept in a high-impedance state HiZ) from data transmission paths while the bit data to be transmitted on the defective via may be detoured. DBI encoding and decoding may be executed in the IF chip 11, responsive to the redundancy enable signal RedEN being greater than "0". When the redundancy enable signal RedEN is equal to "0" indicating that there is no redundancy bit usage due to a defective via. All the chip data ports Dchip[7:0] may be coupled to all the TSV data ports Dtsv[7:0] and the DBI bit may be transmitted to the data redundancy port Dred and DBI encoding and decoding may be executed in the core chip 12.

Turning back to FIG. 4A, in a write operation, the IF DBI decoder 23 may be activated by IFDecoderEn signal received at an enable (EN) input of the IF DBI decoder 23 from a selector 41a. The selector 41a may receive the RedEn signal and a signal from a mode register 20a and may provide the IFDecoderEn signal responsive to the RedEn signal and the signal from the mode register 20a. FIG. 4B is a truth table of mode register setting and enable inputs of the IF chip 11 and the core chip 12 of FIG. 4A, in case of the RedEn signal being indicative of no defective via on the TSV data node 271 (e.g., "0"), in accordance with an embodiment of the present disclosure. Because of no defective via on the TSV data node 271, the selector 41a may provide the IFDecoderEn and IFEncoderEn signals in an inactive state (e.g., "0") responsive to the RedEn signal being indicative of no defective via on the TSV data node 271. Thus, TSV data nodes 271 may be used for transmitting DBI-encoded data, and a redundant TSV node 272 may transmit the DBI bit from the data redundancy port Dred of the IF domino circuit 210 to the data redundancy port Dred of the core domino circuit 220. In case of the RedEn signal being indicative of a location of the defective via on the TSV data node 271 (e.g., equal to or greater than "1"), the selector 41a may provide the IFDecoderEn and IFEncoderEn signals with the signal of the mode register 20a as shown in FIG. 4C. The IF DBI decoder 23 may decode the DBI-encoded data from the input buffer 231 responsive to the DBI bit received from the DBI input buffer 232, if the IFDecoderEn signal is in the active state. The IF DBI decoder 23 may provide the data after decoding the DBI-encoding to the output buffer 234 that may be transmitted to the core chip 12 through the IF domino circuit 210 and the TSV data nodes 271 (except the defective via) and the redundant TSV node 272 (in place of the defective via), and the DBI bit may not be transmitted to the core chip 12 via the redundant TSV node 272.

In the core die 12, a selector 41b may receive the RedEn signal and a signal from a mode register 20b and may provide the COREDecoderEn signal responsive to the RedEn signal and the signal from the mode register 20b. For example, the selector 41b may provide the COREDecoderEn signal in an active state (e.g., "1") responsive to the write DBI enable bit (MR-WDBI enable) in an active state (e.g., "1") while the RedEn signal is indicative of no defective via on the TSV data node 271, as shown in FIG. 4B. Thus, the input buffer 281 may receive the data from the Dchip ports of the core domino circuit 220, when the TSV data ports Dtsv of the core domino circuit 220 receives the data from the TSV data node 271 and the DBI input buffer 282 may receive the DBI bit from the DBIchip port of the core domino circuit 220, when the data redundancy port Dred of the core domino circuit 220 receives the DBI bit from the redundant TSV node 272. The core DBI decoder 28 may be activated by COREDecoderEn signal received at an enable (EN) input of the core DBI decoder 28 from the selector 41b. The core DBI decoder 28 may decode the DBI-encoded data from the input buffer 281 responsive to the DBI bit received from the DBI input buffer 282, if the signal of the mode register 20b is in the active state. The core DBI decoder 28 may provide the data after decoding the DBI-encoding to the memory array 25. For example, the selector 41b may provide the COREDecoderEn signal in an inactive state (e.g., "0") as shown in FIG. 4C, responsive to the RedEn signal being equal to or greater than "1", indicative of the location of the defective via on the TSV data node 271, and the core DBI decoder 28 and core DBI encoder 29 may be deactivated. The TSV data ports Dtsv and the redundant port Dred of the core domino circuit 220 may receive the data from the IF domino circuit 210 through the TSV data nodes 271 and the redundant TSV node 272 with detouring the defective via. The core domino circuit 220 may provide the data to the input buffer 281 and the DBI input buffer 282 from the Dchip and DBIchip ports, respectively. The core DBI decoder 28 may execute no DBI-decoding operation on the received data and may provide the received data to the array 25 as it is.

For example, in a read operation, data may be read from the array 25 and provided to a core DBI encoder 29 in the core chip 12. The core DBI encoder 29 may be activated by COREEncoderEn signal received at an enable (EN) input of the core DBI encoder 29 from the selector 41b. The selector 41b may receive the RedEn signal and the signal from the mode register 20b and may provide the COREEncoderEn signal responsive to the RedEn signal and the signal from the mode register 20b. For example, the selector 41b may provide the COREEncoderEn signal in an active state (e.g., "1") responsive to the read DBI enable bit (MR-RDBI enable) in an active state (e.g., "1") while the RedEn signal is being "0", indicative of no defective via on the TSV data node 271, as shown in FIG. 4B. Thus, the TSV data node 271 may be used for transmitting DBI-encoded data from the TSV data ports Dtsv of the core domino circuit 220 to the TSV data ports Dtsv of the IF domino circuit 210, and a redundant TSV node 272 may transmit the DBI bit from the data redundancy port Dred of the core domino circuit 220 to the data redundancy port Dred of the IF domino circuit 210. For example, the selector 41b may provide the COREEncoderEn signal in an inactive state (e.g., "0") as shown in FIG. 4C, responsive to the RedEn signal being equal to or greater than "1", indicative of a location of the defective via on the TSV data node 271.

The core DBI encoder 29 may encode the data from the array 25 with the DBI algorithm responsive to the active COREEncoderEn signal and may provide the data to the output buffer 291 and an active DBI bit to a DBI output buffer 292, respectively. If the COREEncoderEn signal in an inactive state (e.g., "0"), the core DBI encoder 29 may not apply DBI encoding and the data is provided to the core domino circuit 220 via the output buffer 291. The core domino circuit 220 may receive the data and the DBI bit at the Dchip ports and the DBI chip port from the output buffer 291 and the DBI output buffer 292, respectively. The core domino circuit 220 may transmit the data and the DBI bit to the IF chip 11 through the TSV data node 271 and the redundant TSV node 272 from the TSV data ports Dtsv and the data redundancy port Dred, respectively, if the RedEn signal is equal to "0" indicative of no defective via on the TSV data node 271. The TSV data ports Dtsv and the redundant port Dred of the core domino circuit 220 may provide the data from the core domino circuit 220 through the TSV data node 271 and the redundant TSV node 272 with detouring the defective via, if the RedEn signal is equal to or greater than "1", indicative of the location of the defective via on the TSV data node 271.

The IF domino circuit 210 may receive the data through the TSV data node 271 and the redundant TSV node 272 at the TSV data ports Dtsv and the data redundancy port Dred with detouring the defective via, if the RedEn signal is equal to or greater than "1". The IF DBI encoder 24 may be activated by IFencoderEn signal received at an enable (EN) input of the IF DBI encoder 24 from the selector 41a. The selector 41a may receive the RedEn signal and the signal from the mode register 20a and may provide the IFEncoderEn signal responsive to the RedEn signal and the signal from the mode register 20a. For example, the selector 41a may provide the IFEncoderEn signal in an active state (e.g., "1") responsive to the read DBI enable bit (MR-RDBI enable) in an active state (e.g., "1") while the RedEn signal is equal to or greater than "1", indicative of the defective via on the TSV data node 271, as shown in FIG. 4C. The IF DBI encoder 24 may encode the data from the IF domino circuit 210 via an input buffer 245 with the DBI algorithm responsive to the active IFEncoderEn signal and may provide the DBI-encoded data to an output buffer 241 and an active DBI bit to a multiplexer 243, respectively.

The IF domino circuit 210 may receive the data and the DBI bit through the TSV data node 271 and the redundant TSV node 272 at the TSV data ports Dtsv and the data redundancy port Dred, respectively, if the RedEn signal is equal to "0" indicative of no defective via on the TSV data node 271. The IF domino circuit 210 may provide the data to an input buffer 245 and the DBI bit to the DBI input buffer 244. The selector 41a may provide the IFEncoderEn signal in an inactive state (e.g., "0") responsive to the RedEn signal being "0" as shown in FIG. 4B. The IF DBI encoder 24 may provide the data from the input buffer 245 as provided from the input buffer 245 to the output buffer 241 responsive to the inactive IFEncoderEn signal. The DBI input buffer 244 may provide the DBI bit to the multiplexer 243. The multiplexer 243 may provide the DBI bit that is from either the IF DBI encoder 24 or the core DBI encoder 29 via the DBI input buffer 244, responsive to the IFEncoderEn signal. For example, the multiplexer 243 may provide the DBI bit from the DBI input buffer 244 to a DBI output buffer 242, if the DBI-encoding is performed in the core DBI encoder 29 and the multiplexer 243 may provide the DBI bit from the IF DBI encoder 24 to the DBI output buffer 242, if the DBI-encoding is executed in the IF DBI encoder 24 or no DBI-encoding is executed (then the DBI bit may be in an inactive state "0").

Thus, the core DBI decoder 28 and the core DBI encoder 29 may perform DBI-decoding and DBI-encoding responsive to the DBI bit when the redundancy enable signal RedEN is equal to "0" indicative of no defective via in the TSV data node 271. The redundant TSV node 272 may transmit the DBI bit and DBI-encoded signals are transmitted on vias the TSV data node 271 to reduce currents on the vias of the TSV data node 271. The IF DBI decoder 23 and the IF DBI encoder 24 may perform DBI-decoding and DBI-encoding responsive to the DBI bit when the RedEN signal is greater than "0" indicative of a location of a defective via in the TSV data node and the redundant TSV node 272 may transmit a bit of the data while the defective via is disabled.

FIGS. 5A to 5I are schematic diagrams of data bus coupling between an IF domino circuit 510 and a core domino circuit 520 in a memory chip in accordance with an embodiment of the present disclosure. For example, the IF domino circuit 510 and the core domino circuit 520 may be the IF domino circuit 210 and the core domino circuit 220 in FIG. 4A. In FIGS. 5A to 5I, a number of data bits are eight and there are chip data ports Dchip[0:7] in the IF domino circuit 510 and the core domino circuit 520. However, a number of data bits may not be limited to eight, and the data bus coupling may be applicable for any plurality of data bits.

Figure 5A:
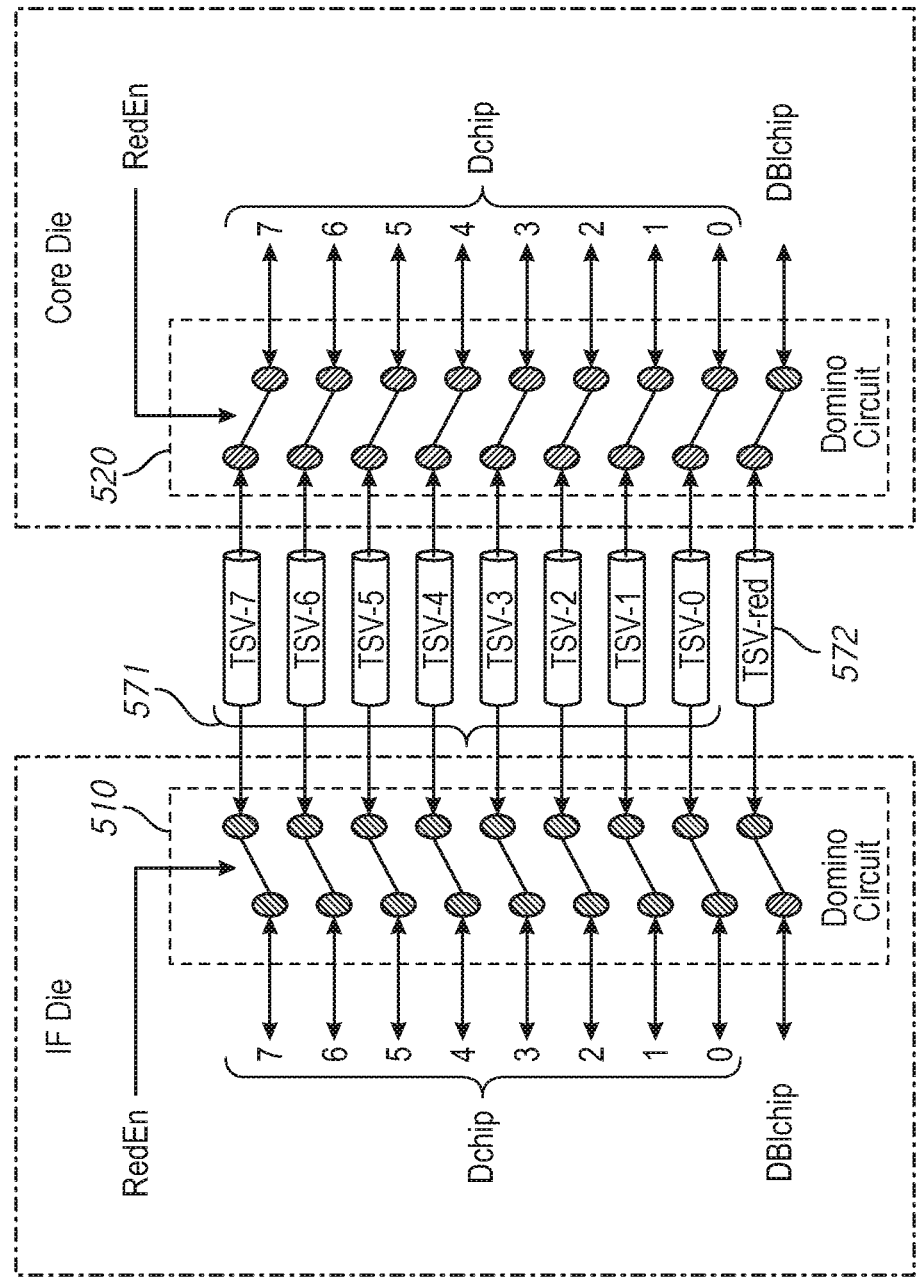

In FIG. 5A, there is no defective via in vias 571 (TSV-0 to TSV-7) between the IF domino circuit 510 and the core domino circuit 520. Thus, chip data ports Dchip[0:7] in the IF domino circuit 510 and chip data ports Dchip[0:7] in the core domino circuit 520 may be coupled by corresponding vias 571 (TSV-0 to TSV-7), respectively. A DBIchip port of the IF domino circuit 510 and a DBIchip port of the core domino circuit 520 may be coupled by a redundancy via 572 (TSV-red).

Figure 5B:
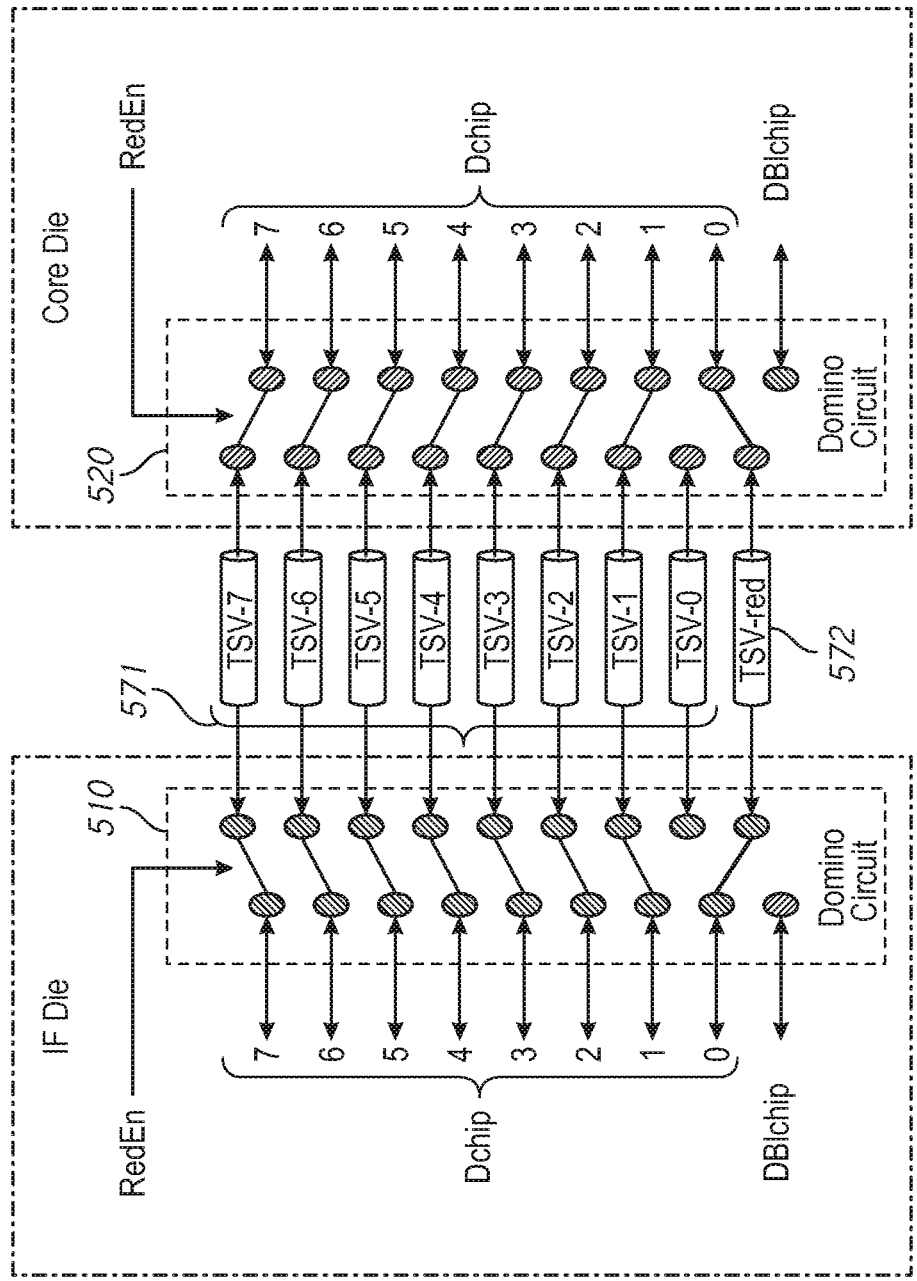

In FIG. 5B, the vias 571 may include a defective via TSV-0. The IF domino circuit 510 may couple a chip data port Dchip[0] to the redundancy via 572 (TSV-red) responsive to the RedEn signal equal to "1". The core domino circuit 520 may couple a chip data port Dchip[0] to the redundancy via 572 (TSV-red) responsive to the RedEn signal equal to "1" indicative of the TSV-0 being defective. Thus, the Dchip[0] ports of the IF domino circuit 510 and the core Domino circuit 520 may be coupled by the redundancy via 572 (TSV-red).

Figure 5C:
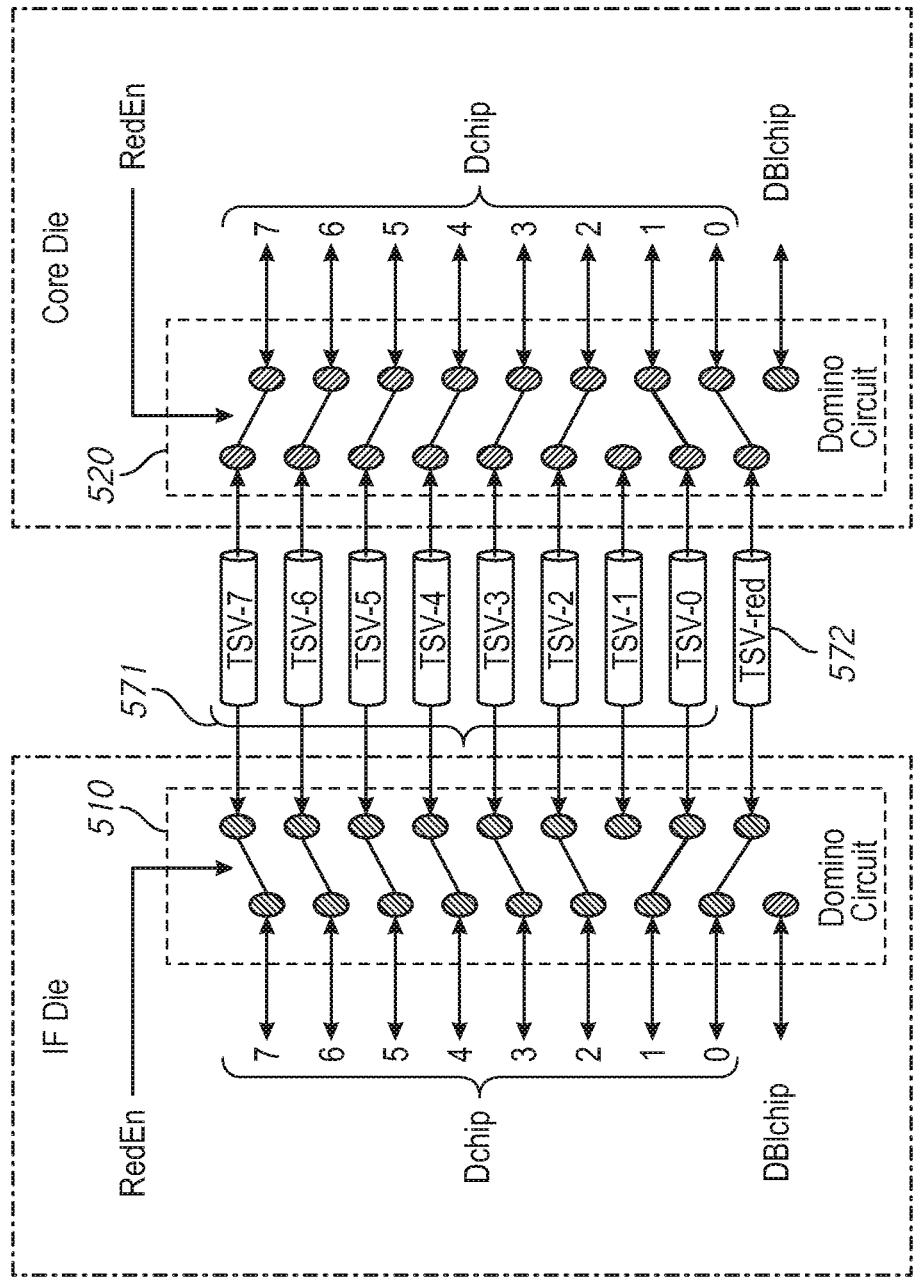

In FIG. 5C, the vias 571 may include a defective via TSV-1. The IF domino circuit 510 may couple chip data ports Dchip[0:1] to the redundancy via 572 (TSV-red) and the via 571 (TSV-0) responsive to the RedEn signal equal to "2" indicative of the TSV-1 being defective. The core domino circuit 520 may couple chip data ports Dchip[0:1] to the redundancy via 572 (TSV-red) and the via 571 (TSV-0) responsive to the RedEn signal equal to "2". Thus, the Dchip[0:1] ports of the IF domino circuit 510 and the core Domino circuit 520 may be coupled by the redundancy via 572 (TSV-red) and the via 571 (TSV-0).

Figure 5D:
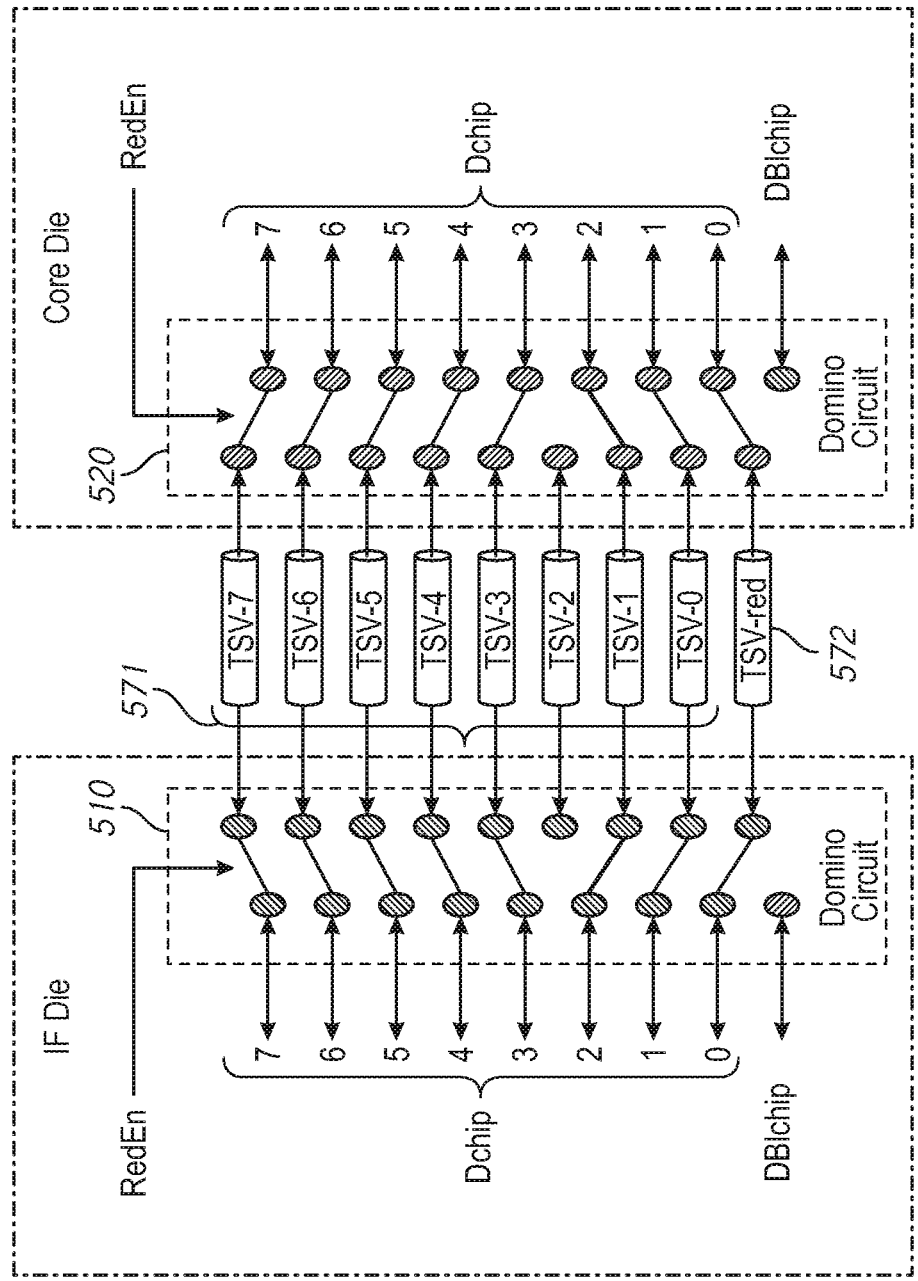

In FIG. 5D, the vias 571 may include a defective via TSV-2. The IF domino circuit 510 may couple chip data ports Dchip[0:2] to the redundancy via 572 (TSV-red) and the vias 571 (TSV-0 and TSV-1) responsive to the RedEn signal equal to "3" indicative of the TSV-2 being defective. The core domino circuit 520 may couple chip data ports Dchip[0:2] to the redundancy via 572 (TSV-red) and the vias 571 (TSV-0 and TSV-1) responsive to the RedEn signal equal to "3". Thus, the Dchip[0:2] ports of the IF domino circuit 510 and the core Domino circuit 520 may be coupled by the redundancy via 572 (TSV-red) and the vias 571 (TSV-0 and TSV-1).

Figure 5E:
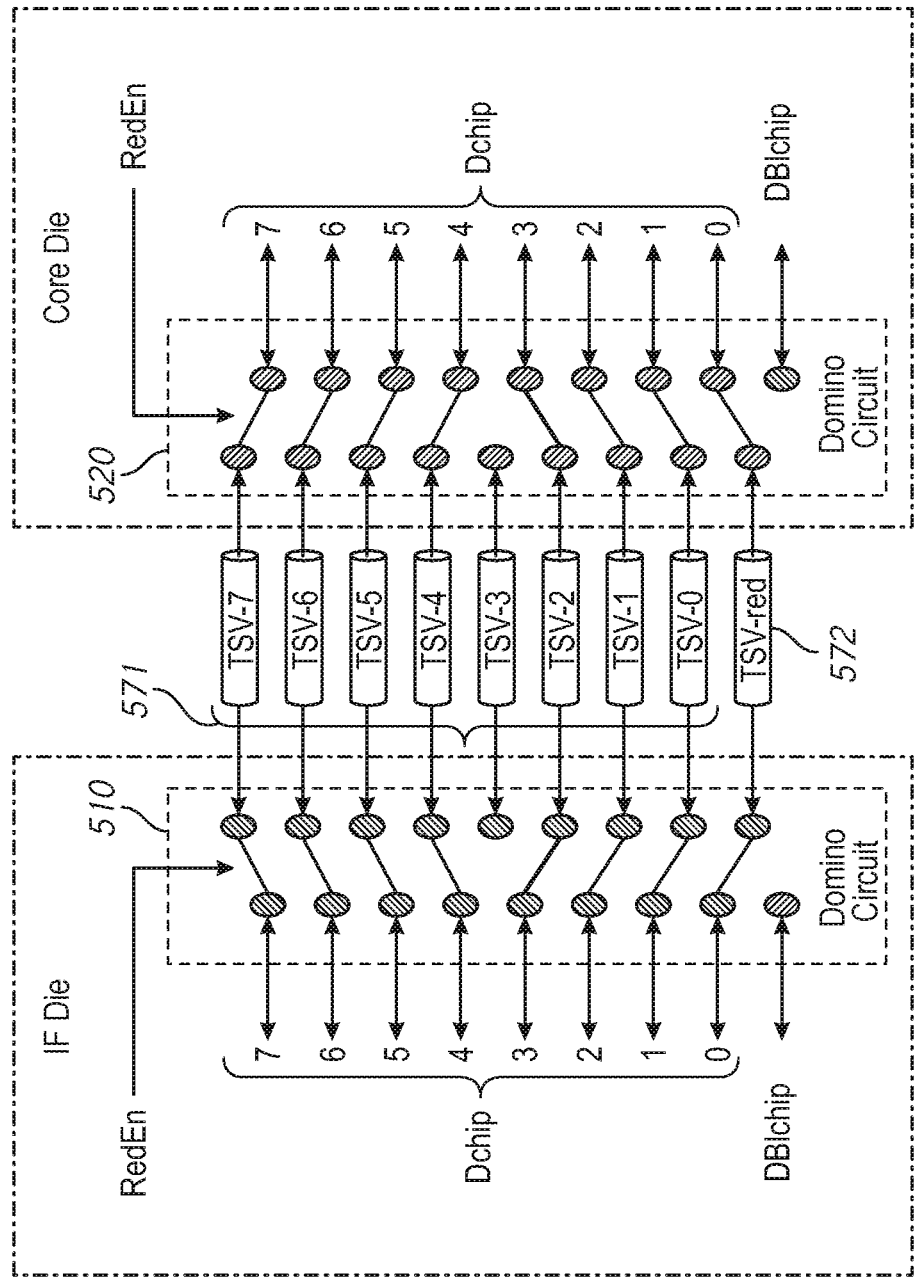

In FIG. 5E, the vias 571 may include a defective via TSV-3. The IF domino circuit 510 may couple chip data ports Dchip[0:3] to the redundancy via 572 (TSV-red) and the vias 571 (TSV-0 to TSV-2) responsive to the RedEn signal equal to "4" indicative of the TSV-3 being defective. The core domino circuit 520 may couple chip data ports Dchip[0:3] to the redundancy via 572 (TSV-red) and the vias 571 (TSV-0 to TSV-2) responsive to the RedEn signal equal to "4". Thus, the Dchip[0:3] ports of the IF domino circuit 510 and the core Domino circuit 520 may be coupled by the redundancy via 572 (TSV-red) and the vias 571 (TSV-0 to TSV-2).

Figure 5F:
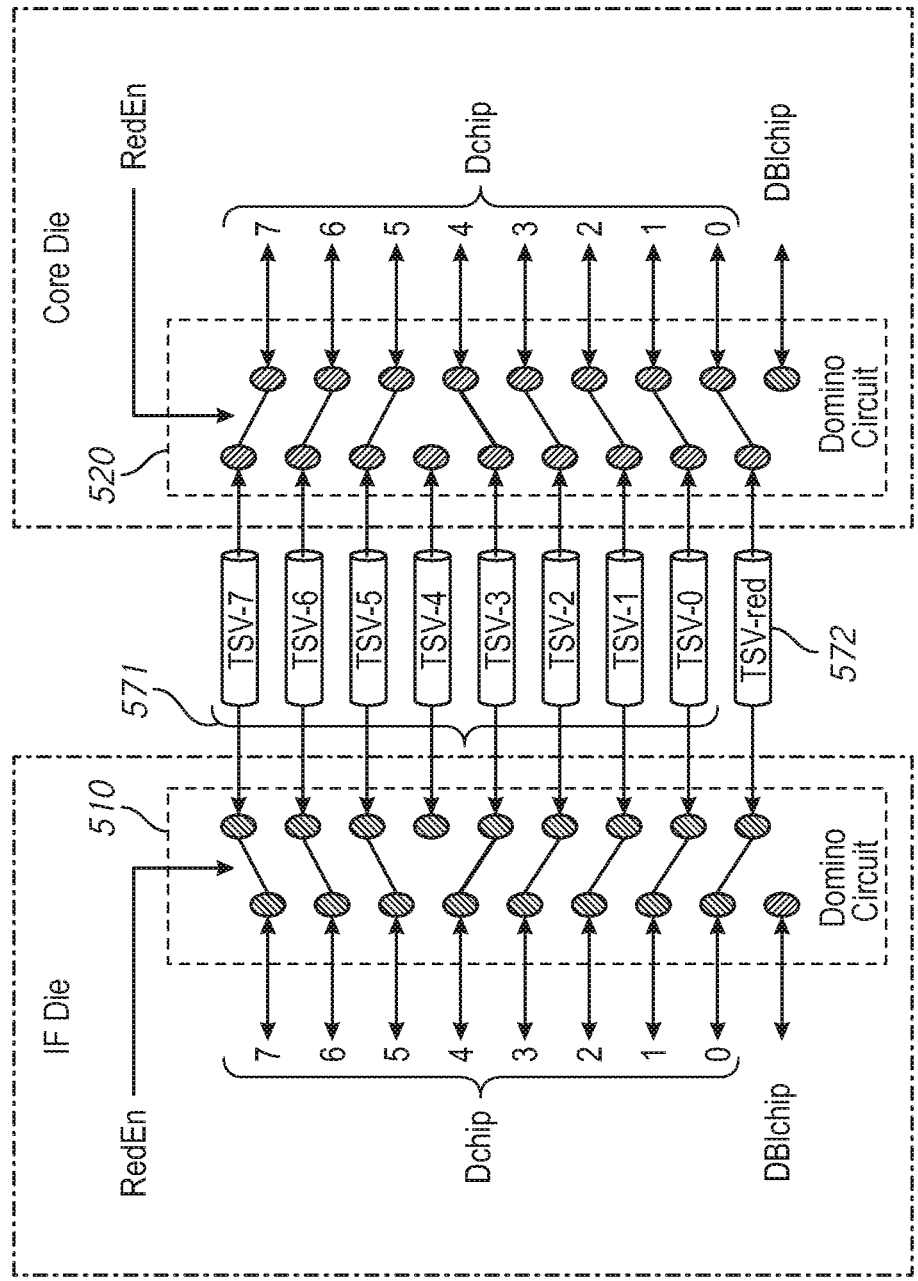

In FIG. 5F, the vias 571 may include a defective via TSV-4. The IF domino circuit 510 may couple chip data ports Dchip[0:4] to the redundancy via 572 (TSV-red) and the vias 571 (TSV-0 to TSV-3) responsive to the RedEn signal equal to "5" indicative of the TSV-4 being defective. The core domino circuit 520 may couple chip data ports Dchip[0:4] to the redundancy via 572 (TSV-red) and the vias 571 (TSV-0 to TSV-3) responsive to the RedEn signal equal to "5". Thus, the Dchip[0:4] ports of the IF domino circuit 510 and the core Domino circuit 520 may be coupled by the redundancy via 572 (TSV-red) and the vias 571 (TSV-0 to TSV-3).

Figure 5G:
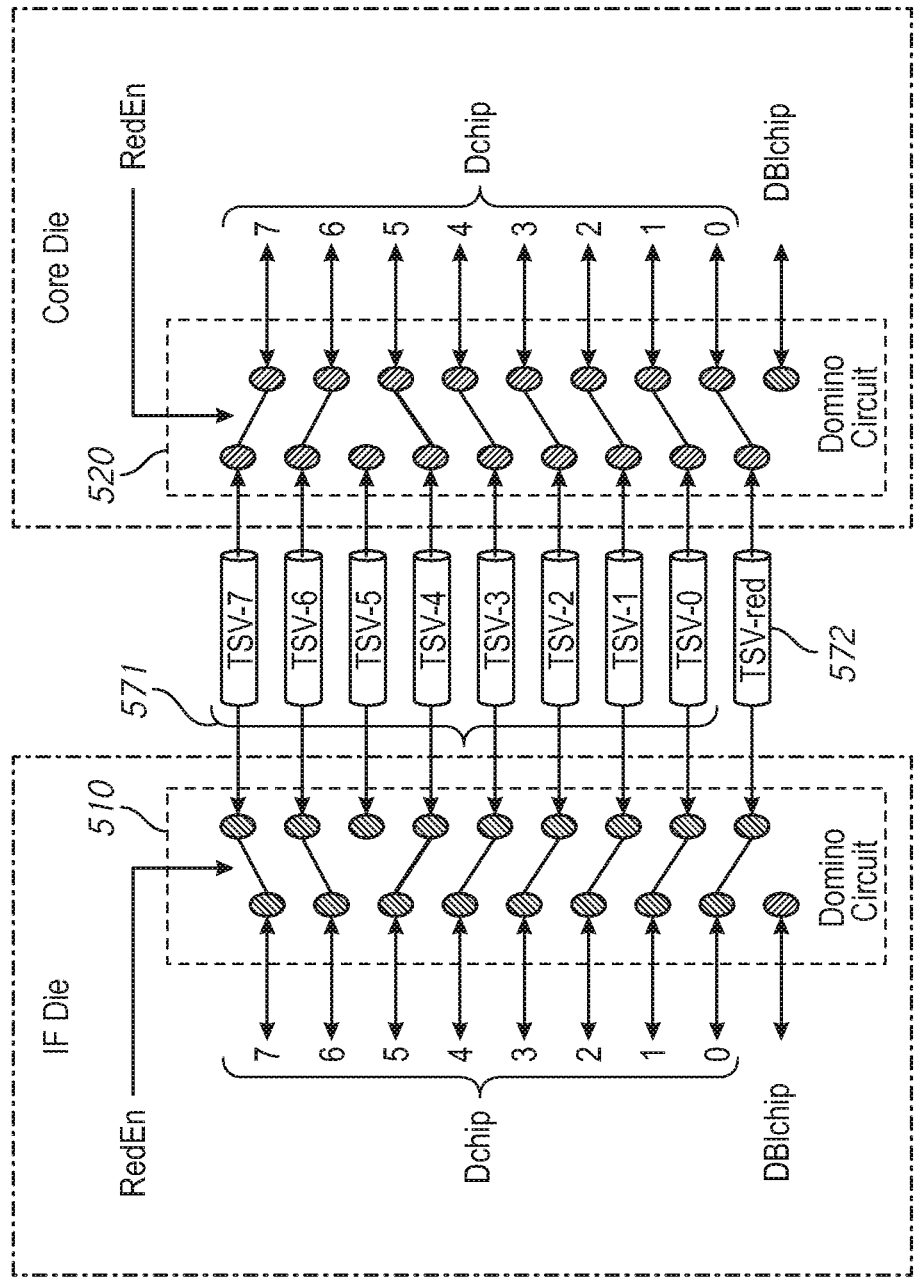

In FIG. 5G, the vias 571 may include a defective via TSV-5. The IF domino circuit 510 may couple chip data ports Dchip[0:5] to the redundancy via 572 (TSV-red) and the vias 571 (TSV-0 to TSV-4) responsive to the RedEn signal equal to "6" indicative of the TSV-5 being defective. The core domino circuit 520 may couple chip data ports Dchip[0:5] to the redundancy via 572 (TSV-red) and the vias 571 (TSV-0 to TSV-4) responsive to the RedEn signal equal to "6". Thus, the Dchip[0:5] ports of the IF domino circuit 510 and the core Domino circuit 520 may be coupled by the redundancy via 572 (TSV-red) and the vias 571 (TSV-0 to TSV-4).

Figure 5H:
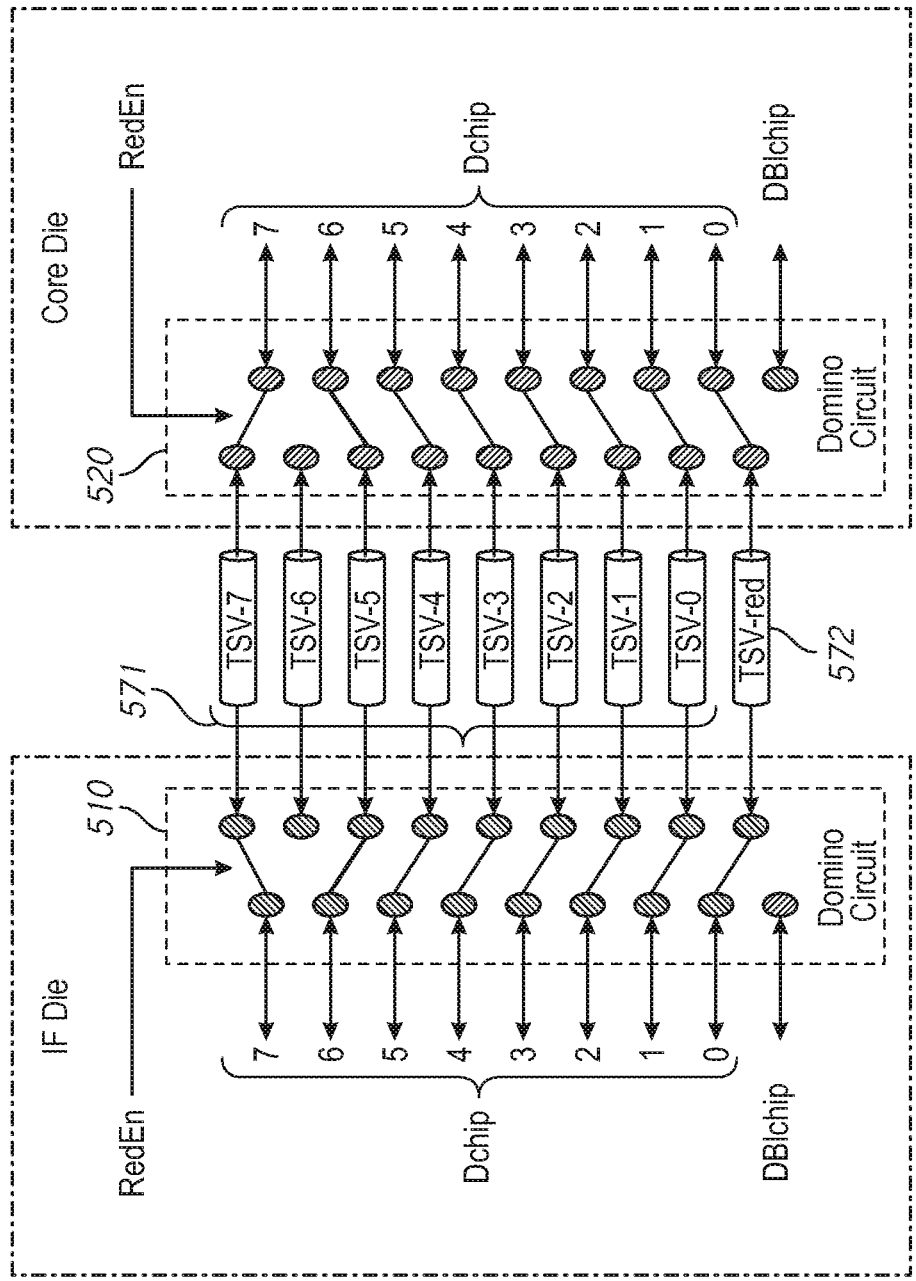
Figure 51:
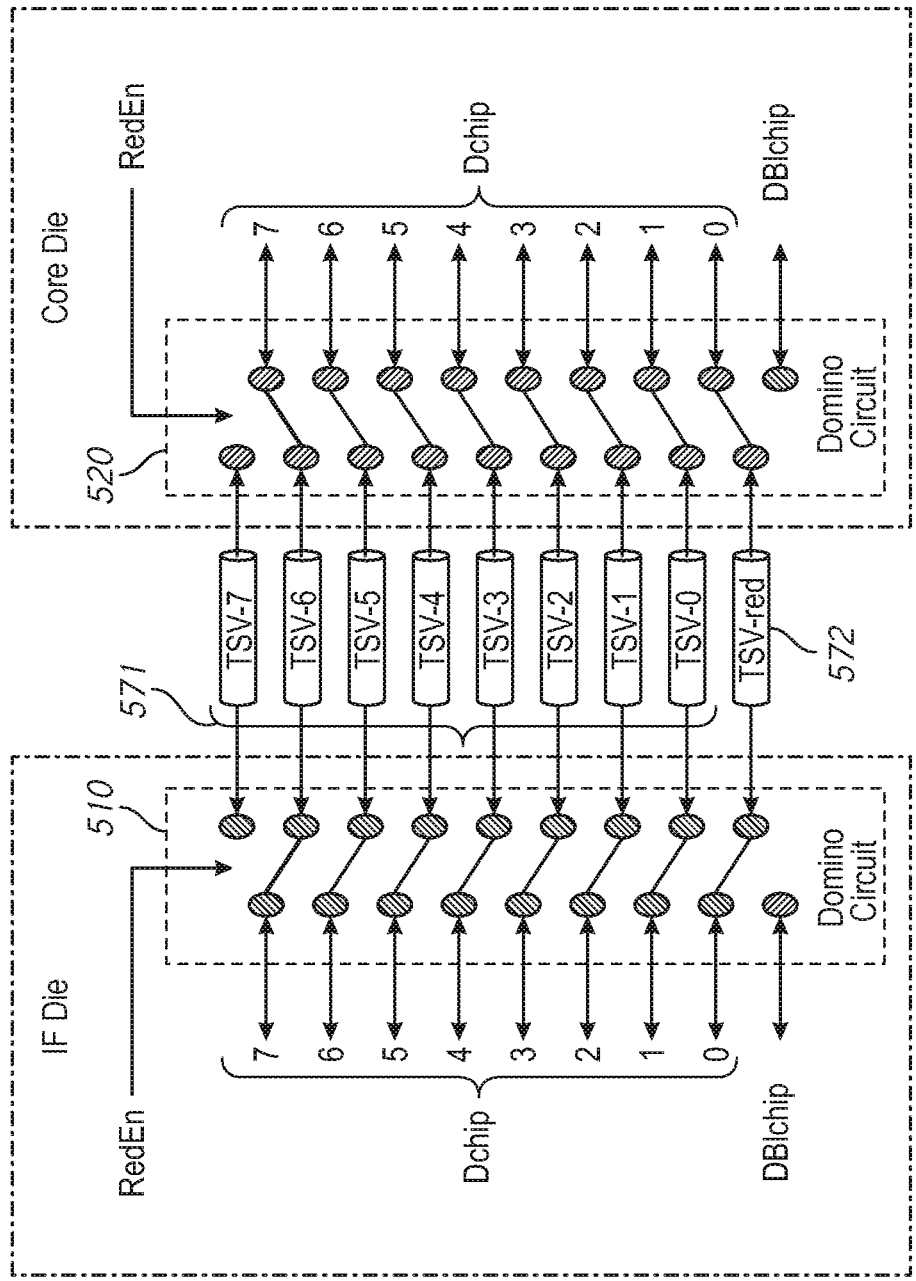

In FIG. 5H, the vias 571 may include a defective via TSV-6. The IF domino circuit 510 may couple chip data ports Dchip[0:6] to the redundancy via 572 (TSV-red) and the vias 571 (TSV-0 to TSV-5) responsive to the RedEn signal equal to "7" indicative of the TSV-6 being defective. The core domino circuit 520 may couple chip data ports Dchip[0:6] to the redundancy via 572 (TSV-red) and the vias 571 (TSV-0 to TSV-5) responsive to the RedEn signal equal to "7". Thus, the Dchip[0:6] ports of the IF domino circuit 510 and the core Domino circuit 520 may be coupled by the redundancy via 572 (TSV-red) and the vias 571 (TSV-0 to TSV-5).

In FIG. 5I, the vias 571 may include a defective via TSV-7. The IF domino circuit 510 may couple chip data ports Dchip[0:7] to the redundancy via 572 (TSV-red) and the vias 571 (TSV-0 to TSV-6) responsive to the RedEn signal equal to "8" indicative of the TSV-7 being defective. The core domino circuit 520 may couple chip data ports Dchip[0:7] to the redundancy via 572 (TSV-red) and the vias 571 (TSV-0 to TSV-6) responsive to the RedEn signal equal to "8". Thus, the Dchip[0:7] ports of the IF domino circuit 510 and the core Domino circuit 520 may be coupled by the redundancy via 572 (TSV-red) and the vias 571 (TSV-0 to TSV-6).

When the RedEn signal greater than "0", the DBI bit may not be transmitted through the redundancy via 572 (TSV-red) and DBI-encoding and DBI-decoding may be performed in the IF die, because the redundancy via 572 (TSV-red) may be used for repairing the defective via in the vias 571 instead.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a first set of terminals including:
   a plurality of first terminals configured to receive a plurality of bits of a data signal, respectively; and
   a second terminal configured to receive a data bus inversion (DBI) signal, the DBI signal indicating whether the data signal is inverted in logic level;
   a second set of terminals including:
   a plurality of third terminals; and
   a fourth terminal; and
   a first switch circuit coupled between the first set of terminals and the second set of terminals and supplied with first control information,
   wherein the first switch circuit is configured to couple the plurality of first terminals to the plurality of third terminals, respectively, and couple the second terminal to the fourth terminal when the first control information is in a first state, and
   wherein the first switch circuit is further configured to couple one of the plurality of first terminals to the fourth terminal and couple remaining ones of the first terminals to selected ones of the third terminals, respectively, when the first control information is in a state other than the first state.

2. The apparatus of claim 1, further comprising a plurality of first vias coupled to the third terminals, respectively, and a second via coupled to the fourth terminal.

3. The apparatus of claim 2, wherein the apparatus further includes a first die and a second die,
   wherein the first die includes the first set of terminals, the second set of terminals and the first switch circuit, and
   wherein the first die and the second die are stacked with each other with intervention of the plurality of first vias and the second via.

4. The apparatus of claim 3, wherein one of the first die and the second die includes the plurality of first vias and the second via.

5. The apparatus of claim 3, wherein the first die includes at least one of a first DBI decoder and a first DBI encoder,
   wherein the second die includes at least one of a second DBI decoder and a second DBI encoder,
   wherein the at least one of the second DBI decoder and the second DBI encoder in the second die is configured to be activated when the control information is in the first state, and
   wherein the at least one of the first DBI decoder and the first DBI encoder in the first die is configured to be activated when the control information is in another state than the first state.

6. The apparatus of claim 5, wherein the second die includes:
   a third set of terminals;
   a fourth set of terminals; and
   a second switch circuit inserted between the third set of terminals and the fourth set of terminals, wherein the third set of terminals includes:
  a plurality of fifth terminals coupled to the plurality of first vias, respectively; and
  a sixth terminal coupled to the second via;
wherein the fourth set of terminals includes:
  a plurality of seventh terminals; and
  an eighth terminal,
wherein the first switch circuit is configured to couple the plurality of fifth terminals to the plurality of seventh terminals, respectively, and couple the sixth terminal to the eighth terminal when the first switch circuit couples the plurality of first terminals to the plurality of third terminals, respectively, and couples the second terminal to the fourth terminal, and
wherein the second switch circuit is further configured to couple one of the plurality of seventh terminals to the sixth terminal and couple remaining ones of the seventh terminals to selected ones of the fifth terminals, respectively, when the first switch circuit couples one of the plurality of first terminals to the fourth terminal and further couples remaining ones of the first terminals to selected ones of the third terminals, respectively.

7. The apparatus of claim 1, wherein the first and second sets of terminals and the first switch circuit are included in a first die, and
  wherein the first die includes at least one of a first DBI decoder and a first DBI encoder.

8. The apparatus of claim 7, wherein the first die is coupled to a second die including a memory array.

9. The apparatus of claim 1, wherein the first and second sets of terminals and the first switch circuit are included in a first die, and the first die is coupled to a second die,
  wherein the first die includes the first set of terminals, the second set of terminals and the first switch circuit, and
  wherein the second die includes:
    a third set of terminals;
    a fourth set of terminals; and
    a second switch circuit between the third set of terminals and the fourth set of terminals.

10. The apparatus of claim 1, wherein the first control information is a redundancy enable signal.

* * * * *